(12) United States Patent
Wada

(10) Patent No.: US 6,426,901 B2
(45) Date of Patent: Jul. 30, 2002

(54) LOGIC CONSOLIDATED SEMICONDUCTOR MEMORY DEVICE HAVING MEMORY CIRCUIT AND LOGIC CIRCUIT INTEGRATED IN THE SAME CHIP

(75) Inventor: Osamu Wada, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/461,298

(22) Filed: Dec. 15, 1999

(30) Foreign Application Priority Data

Dec. 16, 1998 (JP) .......................... 10-358040

(51) Int. Cl.[7] ............................... G11C 7/00
(52) U.S. Cl. ............ 365/200; 365/189.05; 365/225.7; 365/230.03
(58) Field of Search ................... 365/200, 230.03, 365/230.01, 225.7, 189.05, 189.01

(56) References Cited

U.S. PATENT DOCUMENTS

| | | | |
|---|---|---|---|
| 5,698,876 A | * 12/1997 | Yabe et al. | .............. 257/296 |
| 5,914,907 A | * 6/1999 | Kobayashi et al. | .... 365/230.03 |
| 5,970,016 A | * 10/1999 | Ohsawa | ................ 365/230.03 |
| 5,995,404 A | * 11/1999 | Nakaumura et al. | .......... 365/63 |
| 6,088,293 A | * 7/2000 | Ho | .............................. 365/233 |
| 6,157,583 A | * 12/2000 | Starnes et al. | .............. 365/200 |
| 6,160,745 A | * 12/2000 | Hashimoto | .................. 365/200 |

OTHER PUBLICATIONS

IEEE Journal of Solid-State Circuits, "A Configurable DRAM Macro Design for 2112 Derivative Organization to be Synthesized Using a Memory Generator", vol. 33, No. 11, Nov. 1998, Tomoaki YABE, et al.

* cited by examiner

Primary Examiner—Hoai V. Ho
(74) Attorney, Agent, or Firm—Banner & Witcoff, Ltd.

(57) ABSTRACT

A sub memory macro is constituted of a plurality of memory cell arrays, a data line pair DQ, /DQ arranged over the memory cell arrays, a DQ buffer, a DQ switching circuit, and an input/output (I/O) buffer arranged in a column direction. The DQ buffer is connected to the data line pair DQ, /DQ and holds data readout from a memory cell or data to be written to the memory cell. The DQ switch circuit is connected to the DQ buffer and switches to a redundancy cell in accordance with an address. The input/output (I/O) buffer is connected to the DQ switching circuit and hold input/output data. A DRAM macro cell is constituted by arranging the sub memory macros in a row direction.

8 Claims, 7 Drawing Sheets

US 6,426,901 B2

LOGIC CONSOLIDATED SEMICONDUCTOR MEMORY DEVICE HAVING MEMORY CIRCUIT AND LOGIC CIRCUIT INTEGRATED IN THE SAME CHIP

BACKGROUND OF THE INVENTION

The present invention relates to a logic consolidated semiconductor memory device in which a memory for storing data and a logic circuit for performing a predetermined arithmetic computation of the data are integrated in the same chip.

This application is based on Japanese Patent Application No. 10-358040 filed Dec. 16, 1998, the contents of which is incorporated herein by reference.

FIG. 1 shows a layout of elements on a chip of a conventionally-used logic consolidated semiconductor memory device. As shown in FIG. 1, a chip 61 has a logic section 62, a memory section 63 and an I/O section 64. The logic section 62 includes a circuit for a predetermined arithmetic computation. The memory section 63 is constituted of a static random access memory (SRAM), a dynamic random access memory (DRAM), or the like.

FIG. 2 is a layout showing an example of a structure of a memory macro cell of a conventionally-used DRAM. To be more specific, this example shows a memory macro cell 71 of the DRAM (2048 rows×16 columns×128 I/O=4M bit). The DRAM memory macro cell 71 has four 1M-bit memory cell array blocks (MCAB) 72-1 to 72-4, a data pass block (DPB) 73, a control block (CTRB) 74, four memory cell array power supply driver blocks (PWDB) 75-1 to 75-4, a power supply generation block (PWGB) 76, 11 power supply line blocks (PWLB) 77-1 to 77-11, and a single power supply line block (PWLB) 78 which are arranged next to each other.

In the bit memory cell array blocks (MCAB) 72-1 to 72-4, data line pairs DQ0, /DQ0 to DQ127, /DQ127 are arranged. These data lines pair DQ0, /DQ0 to DQ127, /DQ127 are connected to the data pass block 73.

The control block 74 contains a buffer holding a row address strobe signal (/RAS), a buffer having a row address, a buffer holding a column addresss strobe signal (/CAS), a buffer holding a column address, and a buffer holding a write enable signal (/WE). The control block 74 not only predecodes the row address and column address but also controls various operations of the memory.

The power source generation block 76 is constituted of a reference voltage generation circuit for generating a reference voltage, such as a band gap reference circuit. Each of the power supply driver blocks 75-1 to 75-4 generates a substrate potential and a word line driving voltage required for every memory cell array on the basis of the reference voltage generated by the power supply generation block 76. Each of the power supply line blocks 77-1 to 77-11, and 78 has a decoupling capacitor for stabilizing a wiring and a potential of the wiring. The power supply line block 78 differs from the power supply line blocks 77-1 to 77-11 in wiring pattern and capacitance of the decoupling capacitor. Particularly, the capacitance of the decoupling capacitor of the power supply line block 78 is set larger than those of the power supply line blocks 77-1 to 77-11. In some cases, an equalizing circuit for the data line pair is provided in the power supply line block 78 and an equalizing circuit for a column selection line (CSL) is provided in the power supply line blocks 77-1 to 77-11.

In a writing mode, an input data passes through the data pass block 73, a selected data line pair from the pairs DQ0, /DQ0 to DQ127, /DQ127, and a bit line (not shown) selected from the memory cell array blocks 72-1 to 72-4 and is supplied to a memory cell. In data-readout mode, a data read out from a selected memory cell is output through the bit line, a selected data line pair from the pairs DQ0, /DQ0 to DQ127, /DQ127, and the data pass block 73.

FIG. 3 is a layout showing a detailed structure of the data pass block 73. The data pass block 73 has a DQ buffer 73a connected to the data line pairs DQ0, /DQ0, DQ127, /DQ127, a DQ control section 73b, a fuse circuit 73c, and an input/output (I/O) data buffer 73d. The DQ control section 73b selects one from the data line pairs DQ0, /DQ0 to DQ127, /DQ127 in accordance with a column address. The fuse circuit 73c, which is responsible for replacing a defective column with a normal column, has a fuse box for storing an address of the defective column, a fuse latch circuit, and a fuse control circuit.

When a memory micro cell of a conventional DRAM is formed as shown in FIG. 2, it is possible to form a DRAM memory macro cell having a 1×nM bit (n is a natural number) by adding a memory cell array block (MCAB), a power supply driving block (PWDB), a power supply line block (PWLB) and the like. In a conventional technique, although it is possible to increase storage capacity, the number of I/O data lines (data bus) to be connected to the logic section is fixed at 128. Even if a multiplex function is imparted to the I/O buffer 73d, the number of I/O data lines comes to only 64 bits. Furthermore, since the data number is fixed, when the DRAM memory macro cell having a parity bit function is required, an entire DRAM memory macro cell must be newly designed. As a result, longer time is required for designing the DRAM memory macro cell.

BRIEF SUMMARY OF THE INVENTION

The present invention is made in order to overcome the aforementioned problems. An object of the present invention is to provide a semiconductor memory device having a DRAM memory macro cell with an arbitrarily-set number of input/output data lines, and capable of adding a parity bit and a redundancy circuit while preventing an increase of time required for designing.

To attain the aforementioned object, the invention according to a first aspect of the present invention has the following constitution. The semiconductor memory device according to the present invention comprises a logic circuit arranged on a semiconductor substrate; and a memory macro arranged on the semiconductor substrate and having a plurality of sub memory macros, wherein each of the plurality of sub memory macros comprises a plurality of memory cell arrays;

a data line pair arranged over the plurality of memory cell arrays, for transmitting write data and read-out data;

a holding circuit for holding the write data and the read-out data to be transmitted to the data line pair; and an input/output data line pair for connecting the holding circuit and the logic circuit.

Furthermore, in the semiconductor memory device, it is desirable that the plurality of memory cell arrays and the holding circuit be arranged in a column direction; the data line pair and the input/output data line pair be extended in the column direction; and the plurality of sub memory macros be arranged in a row direction.

To attain the aforementioned object, the present invention according to a second aspect is constituted as follows. The semiconductor memory device of the present invention comprises:

a logic circuit arranged on a semiconductor substrate; and a memory macro arranged on the semiconductor substrate and having a plurality of sub memory macros and a redundancy circuit, wherein each of the plurality of sub memory macros comprises a plurality of memory cell arrays a data line pair arranged over the plurality of memory cell arrays, for transmitting write data and read-out data;

a holding circuit for holding the write data and the read-out data to be transmitted to the data line pair; and an input/output data line pair for connecting the holding circuit and the logic circuit, the redundancy circuit comprises a memory element arranged to each of the sub memory macros, for storing a defective address of a corresponding sub memory macro; and a control circuit for comparing the defective address of each sub memory macro stored in the memory element with an input address and replacing a defective memory defined by the defective address with a spare memory when the defective address coincides with the input address.

Furthermore, in the semiconductor memory device, it is desirable that the plurality of memory cell arrays and the holding circuit be arranged in the column direction; the input data line pairs and the input/output data line pairs be extended in the column direction; and the plurality sub memory macros be arranged in the row direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, the embodiments of the present invention will be explained with reference to the accompanying drawings.

[First Embodiment]

Figure 4:
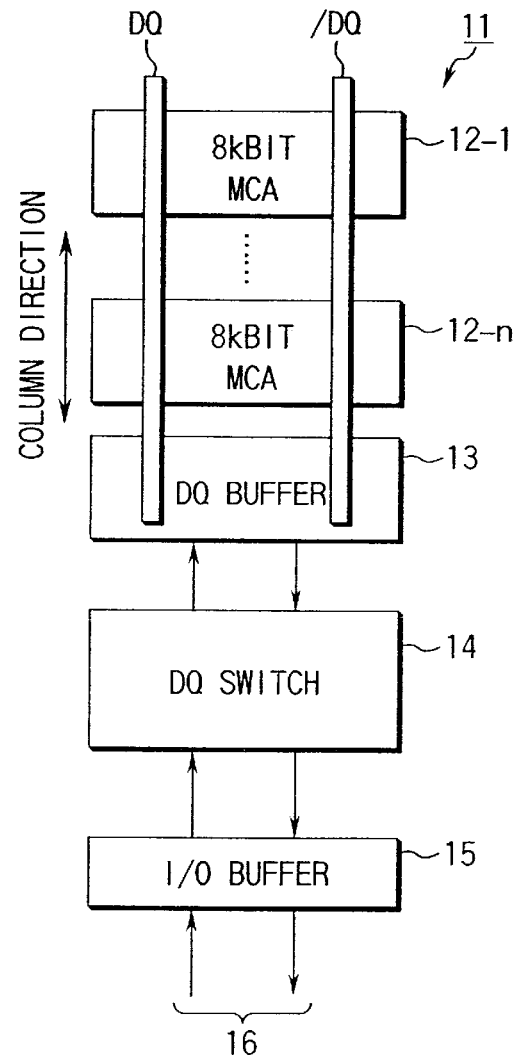
FIG. 4 is a layout showing a structure of a first sub memory macro according to a first embodiment of the present invention.

FIG. 4 shows a structure of a first sub memory macro 11 according to a first embodiment of the present invention. The first sub memory macro 11 has a plurality of memory cell arrays (MCA) 12-1 to 12-n (n=1, 2, 3 . . . ), a data line pair DQ, /DQ, a DQ buffer 13, a DQ switching circuit 14, and an input/output (I/O) buffer 15. To the input/output buffer 15, a 1-bit I/O data line pair 16 is connected.

The data line pair DQ, /DQ is arranged over the memory cell arrays 12-1 to 12-n and selectively connected to the memory cell arrays. The DQ buffer 13 is connected to the data line pair DQ, /DQ and stores data read out from the memory cell or data to be written in the memory cell. The DQ switching circuit 14 is connected to the DQ buffer 13 and controlled in accordance with a column address to replace a defective column with a spare column. The I/O buffer 15 is connected to the DQ switching circuit 14 and stores I/O data.

Each of the memory cell arrays 12-1 to 12-n has a plurality of memory cells, bit lines, word lines, and sense amplifiers (not shown) and has a 8 k-bit capacity. Therefore, if n number of the memory cell arrays 12-1 to 12-n are arranged in a column direction, a capacity of 8×nk bits can be ensured.

Figure 5:
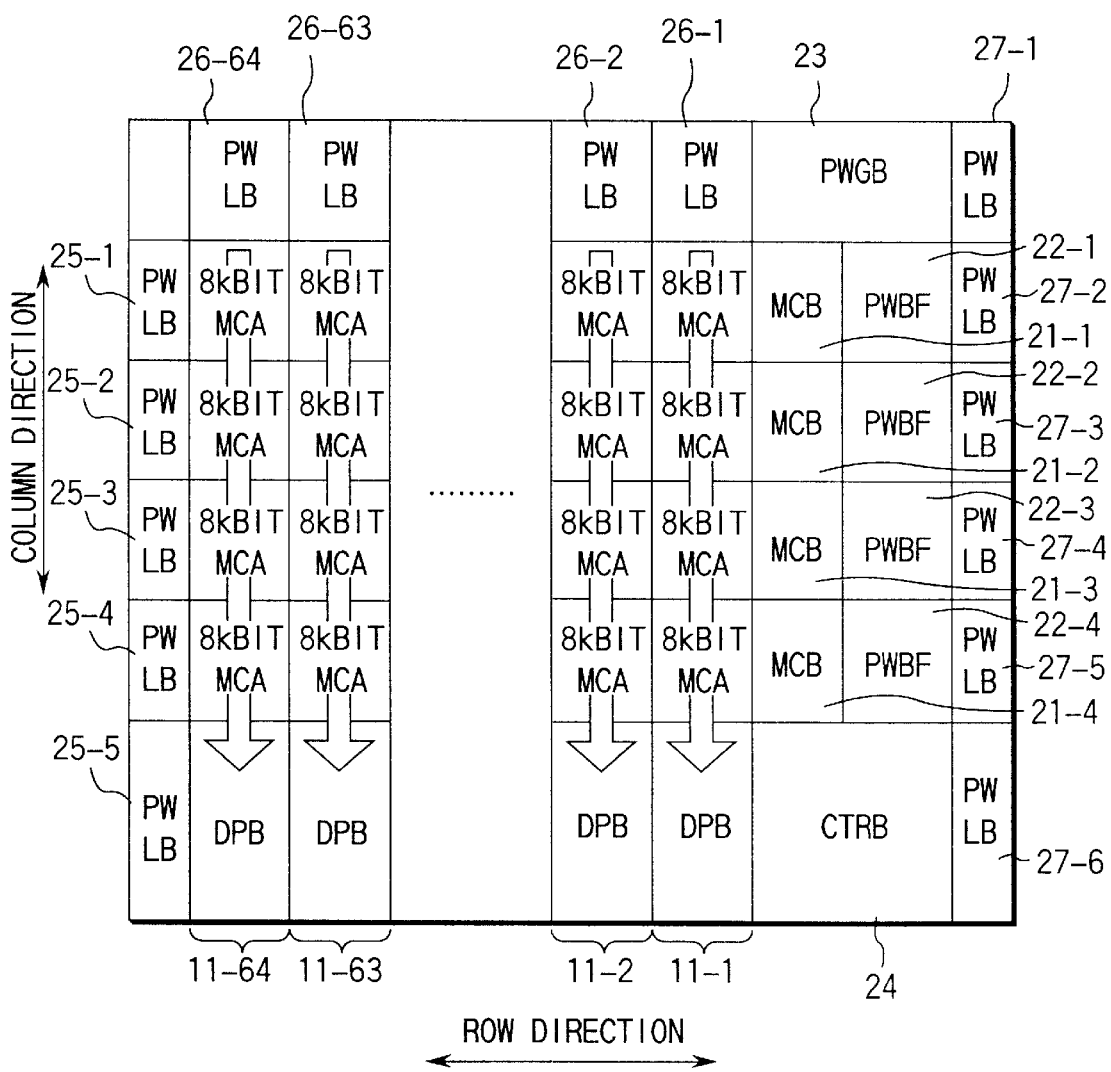
FIG. 5 is a layout showing a structure of a DRAM macro cell using the circuit of FIG. 4.

FIG. 5 shows a layout of a DRAM macro cell of 2M bits having 64 I/O data lines formed by using the first sub memory macro 11. In the 2M-bit DRAM macro cell, first sub memory macross 11-1 to 11-64, each having four memory cell arrays of 8 k bits arranged in a column direction, are arranged in a row direction. In each of the first sub memory macros 11-1 to 11-64, a data pass block (DPB) includes a DQ buffer, a DQ switching circuit, an I/O buffer, and an I/O data line pair.

Four memory array control blocks (MCB) 21-1 to 21-4 are arranged in the column direction so as to correspond to the memory cell arrays at one side of the first sub memory macros 11-1 to 11-64. Power supply buffer blocks (PWBF) 22-1 to 22-4 are arranged next to the corresponding memory array control blocks 21-1 to 21-4. A power supply generation block (PWGB) 23 is arranged next to the memory array control block 21-1 as well as the power supply buffer block 22-1. A control block (CTRB) 24 is arranged next to the memory array control block 21-4 as well as the power supply buffer block 22-4.

The power supply line blocks (PWLB) 25-1 to 25-5 are arranged next to the first sub memory macro 11-64. The power supply line blocks 26-1 to 26-64 are arranged next to the first sub memory macros 11-1 to 11-64, respectively. Power supply line blocks 27-1 to 27-6 are arranged next to the power supply generation block 23, power supply buffer blocks 22-1 to 22-4, and the control block 24, respectively.

The control block 24 includes a buffer holding a row addresss strobe signal (/RAS), a buffer holding a row address, a buffer holding a column address strove signal (/CAS), a buffer holding a column address, and a buffer holding a write enable signal (/WE). The control block 24 not only predecodes the row address and column address but also controls various operations of the memory. The memory array control blocks 21-1 to 21-4 have a row-decoder and a column decoder and select a memory cell in accordance with a signal from the control block 24. The memory array control blocks further control connection between the bit line pair and the data line pair DQ, /DQ.

The power supply generation block 23 is constituted of a reference voltage generation circuit for generating a reference voltage, for example, a band gap reference circuit. Each of the power supply buffer blocks 22-1 to 22-4 generates a reference potential and a word line driving voltage required for every memory cell array on the basis of the reference voltage generated by the power supply generation block 23.

Each of the power supply line blocks 25-1 to 25-5, 26-1 to 26-64, 27-1 to 27-6 has a plurality of wirings for supplying power from the power supply generation block 23 to each section. Furthermore, a decoupling capacitor is attached to each of the power supply line blocks for stabilizing a potential from the wiring. The power supply line blocks 26-1 to 26-64 differ from the power supply line blocks 25-1 to 25-5, 27-1 to 27-6 in wiring pattern and capacitance of the decoupling capacitor. The capacitances of the decoupling capacitors of the power supply line blocks 26-1 to 26-64 are set larger than those of the power supply line blocks 25-1 to 25-5, 27-1 to 27-6. In some cases, an equalizing circuit for the data line pair may be provided in the power supply line blocks 26-1 to 26-64. Also, an equalizing circuit of a column selecting line (CSL) may sometimes be provided in the power supply line blocks 25-1 to 25-5, 27-1 to 27-6.

According to the first embodiment, first sub memory macros 11 each having a plurality of memory cell arrays, the DQ buffer 13, the DQ switching circuit 14, the I/O buffer 15, the input/output data line pair 16 arranged in the column direction, are arranged in the row direction. In other words, each of the first sub memory macros 11 is constituted of a plurality of memory cell arrays, the DQ buffer 13, the DQ switching circuit 14, the I/O buffer 15, and the input/output data line pair 16 arranged in the column direction. The first sub memory macros 11 thus constituted are arranged in the row direction. Therefore, it is possible to arbitrarily set the storage capacity of the memory by changing the number of memory cell arrays to be arranged in the column direction. At the same time, the number of input/output bits can be arbitrarily set by changing the number of the first sub memory macros to be arranged in the row direction. In this manner, a semiconductor memory device can be formed having an arbitrarily set storage capacity and an arbitrarily set number of input/output bits.

[Second Embodiment]

Figure 6:
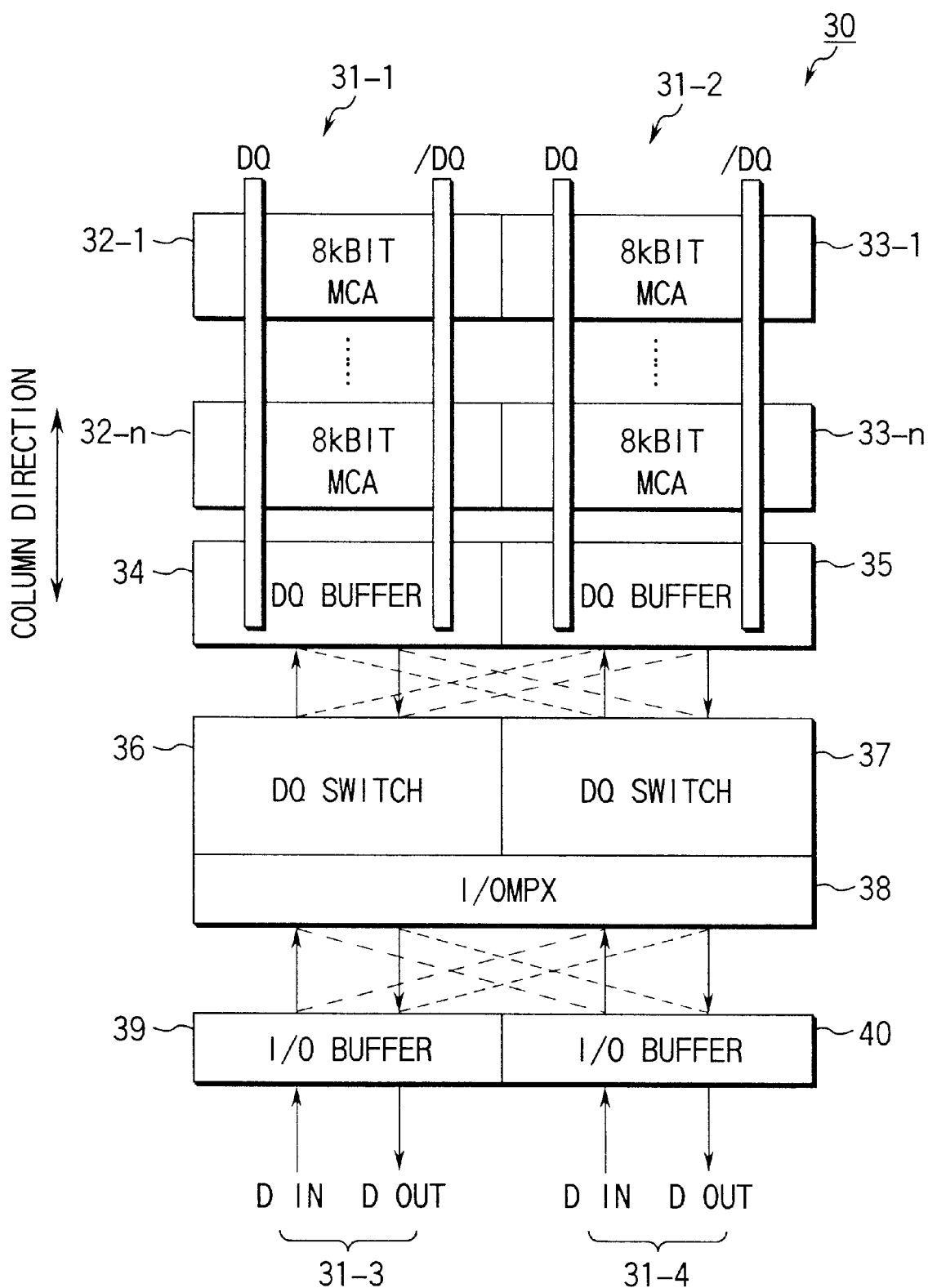
FIG. 6 is a layout showing a structure of a second sub memory macro according to the second embodiment of the present invention.

FIG. 6 is a layout showing a structure of a second sub memory macro according to a second embodiment of the present invention. Unlike in the first sub memory array 11, in the second sub memory macro 30, two memory cell arrays each having 8 k-bits are arranged in the row direction to form a 16 k-bit memory cell array. Simultaneously, two input/output data lines (each corresponding 1 k bit) are arranged. A multiplexer is provided for selecting one of the input/output data lines.

More specifically, the second sub memory macro 30 has a first memory cell array group 31-1 having a plurality of memory cell arrays (MCA) 32-1 to 32-n and a second memory cell array group 31-2 having a plurality of memory cell arrays (MCA) 33-1 to 33-n. A data line pair DQ, /DQ to be selectively connected to the memory cell arrays 32-1 to 32-n is arranged on the first memory cell array 31-1, whereas a data line pair DQ, /DQ to be selectively connected to the memory cell arrays 33-1 to 33-n is arranged on the second memory cell array group 31-2.

The data line pair DQ, /DQ arranged on the first memory cell array group 31-1 are connected to a DQ switching circuit 36 and the DQ switching circuit 37. The data line pair DQ, /DQ arranged on the second memory cell array group 31-2 are connected to a DQ switching circuit 36 and the DQ switching circuit 37. These DQ switching circuits 36, 37 are connected to an input/output multiplexer (I/OMPX) 38 for selecting input/output data lines. To the input/output multiplexer 38, input/output (I/O) buffers 39, 40 for holding input/output data are connected. To these input/output buffers 39, 40, input/output data lines (each having 1 bit) 31-3 and 31-4 are connected.

The DQ switches 36, 37 are selectively connected to the first and second memory cell array groups 31-1, 31-2 in accordance with the column address. The input/output multiplexer 38 connects the input/output buffers 39, 40 selectively to the DQ switches 36, 37 in accordance with the output signal from the control block (described later).

For example, when the second sub memory macro 30 is constituted as a memory macro having 2-bit input/output data lines (each corresponding one bit), the input/output buffer 39 is connected to the DQ switching circuit 36 through the input/output multiplexer 38 whereas the input/output buffer 40 is connected to the DQ switching circuit 37 through the input/output multiplexer 38.

In a writing mode, a writing data input from the input/output data line 31-3 passes through the input/output buffer 39, input/output multiplexer 38, and DQ switching circuit 36 in a sequential order, is supplied to the first memory cell array group 31-1 and written in a selected memory cell of the first memory cell array group 31-1. Furthermore, a writing data input from the input/output data line 31-4 passes through the input/output buffer 40, input/output multiplexer 38, and DQ switching circuit 37 in a sequential order, is supplied to the second memory cell array group 31-2, and written in a selected memory cell of the second memory cell array group 31-2.

In a read-out mode, a data read out from a selected memory cell of the first memory cell array group 31-1, passes reversely through the aforementioned data path, and is output from the input/output data line 31-3, whereas data read out from a selected memory cell of the second memory cell array group 31-2, passes reversely through the aforementioned data path, and is output from the input/output data line 31-4.

On the other hand, in the case where the second sub memory array 30 is constituted as a memory macro having a 1-bit input/output data line by using only the input/output data line 31-3, the input/output buffer 39 is connected to the DQ switching circuit 36 and DQ switching circuit 37 through the input/output multiplexer 38.

In the writing mode, a writing data input from the input/output data line 31-3, passes through the input/output buffer 39, input/output multiplexer 38, either the DQ switching circuit 36 or the DQ switching circuit 37 selected in accordance with a column address, is supplied to either the first memory cell array group 31-1 or the second memory cell array group 31-2, and written into the selected memory cell.

In the read-out mode, a data read out from the selected memory cell of the first memory cell array group 31-1 or the second memory cell array group 31-2, passes reversely through the aforementioned data path, and is output from the input/output data line 31-3.

Figure 7:
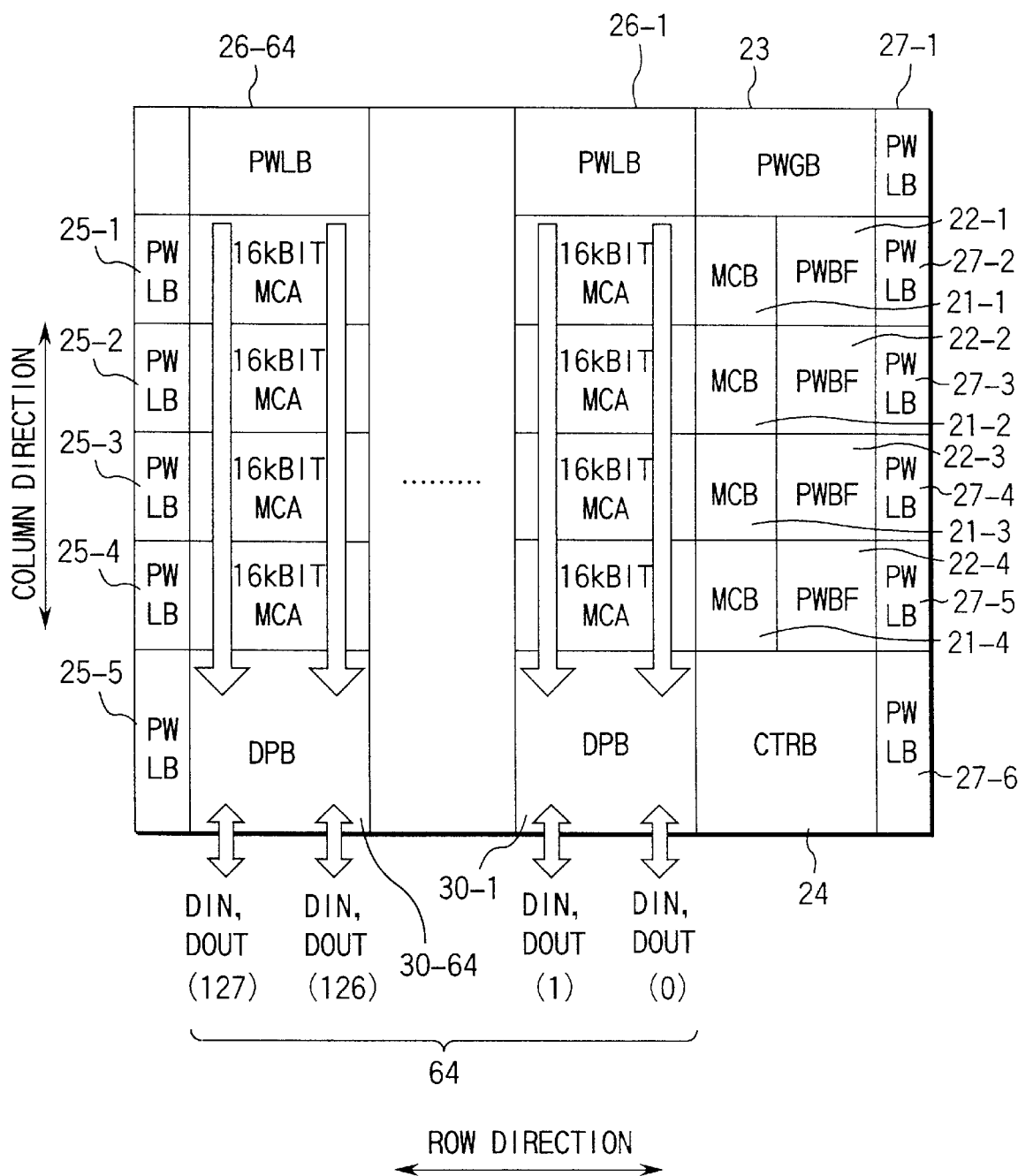
FIG. 7 is a layout showing a structure of a DRAM macro cell using the circuit of FIG. 6.

FIG. 7 shows a layout of a 4M-bit DRAM macro cell having 128 of the input/output data lines by using the second sub memory macro 30. In the 4M bit DRAM macro cell, the second sub memory macros 30-1 to 30-64 each having four 16 k-bit memory cell arrays arranged in a column direction, are arranged in a row direction. In the second sub memory macros 30-1 to 30-64, a data pass block (DPB) includes the DQ buffers 34, 35, the DQ switching circuits 36, 37, the input/output multiplexer 38, the I/O buffers 39, 40, and input/output data lines 31-3, 31-4 shown in FIG. 6. FIG. 7 shows a case of 128I/O. If one of the input/output data lines of the second sub memory macro is used, 64I/O can be realized as described above. Note that, in FIG. 7, like reference symbols are used to designate like structural elements corresponding to those in FIG. 5.

According to the second embodiment, the same effects as those of the first embodiment can be obtained. According to the second embodiment, the number of the input/output data lines can be changed by the input/output multiplexer 38. Therefore, it is possible to easily set the circuit arrangement most suitable for a logic circuit.

When the first and second sub memory macros shown in the first and second embodiments, are applied to, for example, a logic consolidated DRAM, a DRAM most suitable for the logic circuit can be constituted by selecting either the first or the second sub memory macro depending upon in which region of a chip the memory macro is set. For example, in the case where a 4M bit DRAM having 64 input/output data lines is constituted by using the second sub memory macro, 64 memory cell arrays are arranged in the row direction and 4 memory cell arrays are arranged in the column direction as shown in FIG. 7 and the input/output data lines may be set at 64 by the input/output multiplexer. In contrast, when the first sub memory macro is used, the DRAM can be constituted by arranging 8 memory cell arrays in the column direction and 64 memory cell arrays in the row direction as shown in FIG. 5. In this case, the DRAM thus formed is longer in the column direction.

[Third Embodiment]

Figure 8:
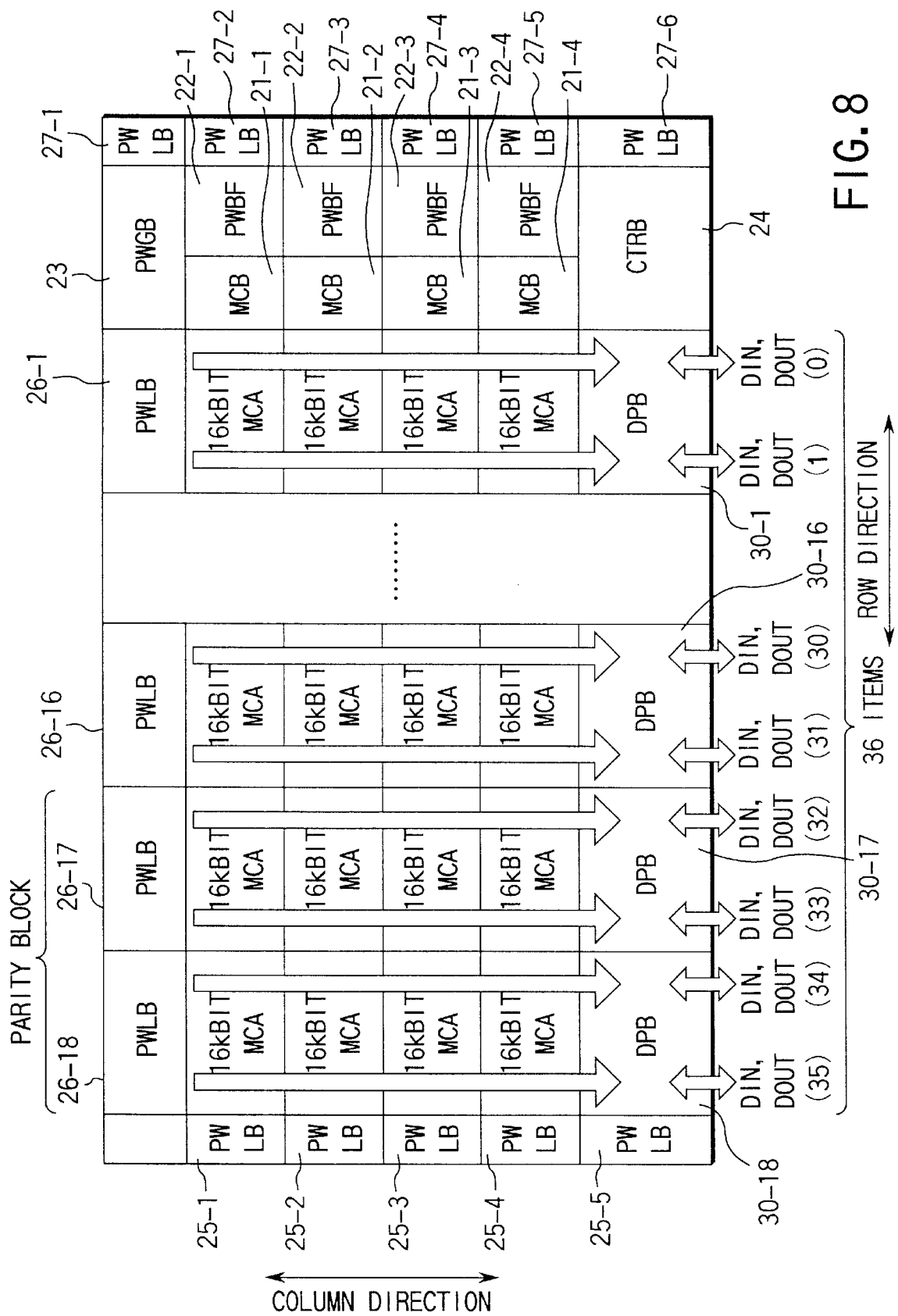
FIG. 8 is a layout showing a structure of a DRAM macro cell having a parity block according to a third embodiment of the present invention.

FIG. 8 shows a layout of a DRAM having a parity bit function according to a third embodiment of the present invention. In FIG. 8, like reference numerals are used to designate like structural elements corresponding to those in FIG. 7. Only different portions will be described.

This embodiment shows a DRAM having 36 input/output data lines constituted by arranging 18 of second sub memory macros 30. Of the 18 second sub memory macros 30-1 to 30-18, the second sub memory macros 30-17 to 30-18 serve as a parity block formed of parity bits.

In the case where the number of input/output data lines is low, it is possible to form a DRAM having a parity bit.

The arithmetic computational circuit of the parity bit may be provided in, for example, the control block 24. This arrangement is advantageous since it is not necessary to change the computational circuit even if the size of the memory cell array is changed.

[Fourth Embodiment]

Figure 9:
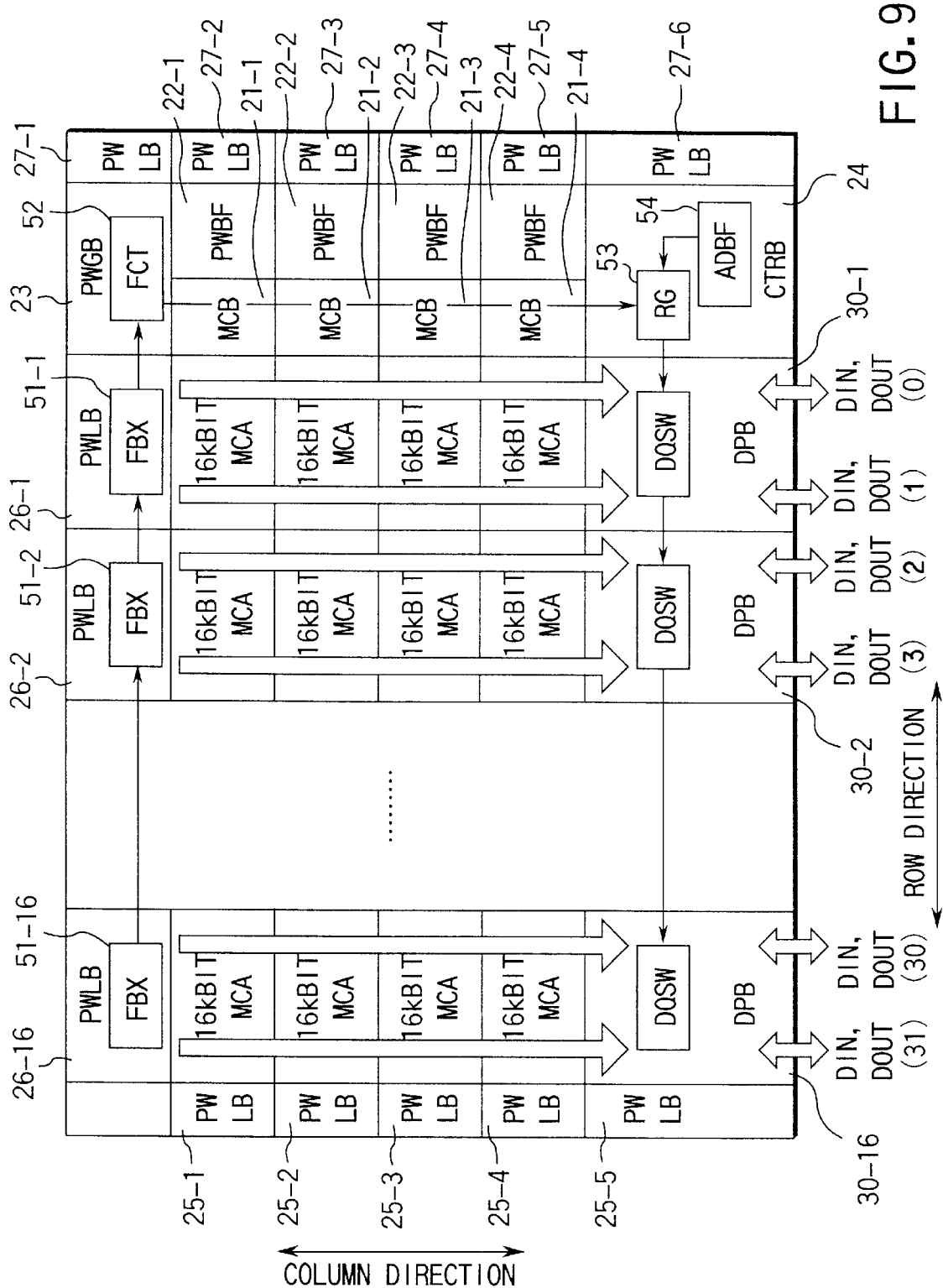
FIG. 9 is a layout showing a structure of a DRAM macro cell having a redundancy circuit according to a fourth embodiment of the present invention.

FIG. 9 shows a layout of a DRAM having a redundancy circuit, according to a fourth embodiment of the present invention. In FIG. 9, like reference numerals are used to designate like structural elements corresponding to those in FIG. 8. Only different portions will be described.

In this embodiment, each memory cell array has a spare column for replacing a defective column. Furthermore, the redundancy circuit has fuse circuits (FBX) 51-1 to 51-16, a fuse control circuit 52, a resistor (RG) 53, and an address buffer 54. The fuse circuits (FBX) 51-1 to 51-16 are arranged in the power source wiring blocks 26-1 to 26-16, respectively. Each of the fuse circuits 51-1 to 51-16 has a memory element having a plurality of fuses and fuse latch circuits. The address of, for example, the corresponding defective column of the second sub memory macro is stored.

A fuse control circuit (FCT) 52 is provided in the power source generation block 23. In the fuse control circuit 52, an absolute address of the defective column within a DRAM macro cell is calculated from the address of the defective column stored in each of the fuse circuits 51-1 to 51-16.

In the control block 24, a resistor (RG) 53 and an address buffer (ADBF) 54 are provided. The resistor 53 has a so-called spear column decoder function for comparing the address supplied from the address buffer 54 and the address of the defective column supplied from the fuse control circuit 52. When these addresses coincide with each other, the resistor 53 outputs a coincidence signal. The coincidence signal is supplied to a DQ switching circuit (DQSW) of each second sub memory macro. Each DQ switching circuit switches from the defective column to the spare column.

According to the fourth embodiment, the resistor 53 is arranged in the control block 24, the fuse circuits 51-1 to 51-16 are arranged in the power supply line blocks 26-1 to 26-16, respectively, each arranged on an opposite side of the data pass block (DPB) of the second sub memory macro, at the same pitches as those of the second sub memory macros. Furthermore, the defective address is calculated by the fuse control circuit 52 arranged in the power supply generation circuit 23. This arrangement makes it possible to readily constitute a redundancy circuit in accordance with an arbitrarily-set number of input/output data lines.

Figure 1:
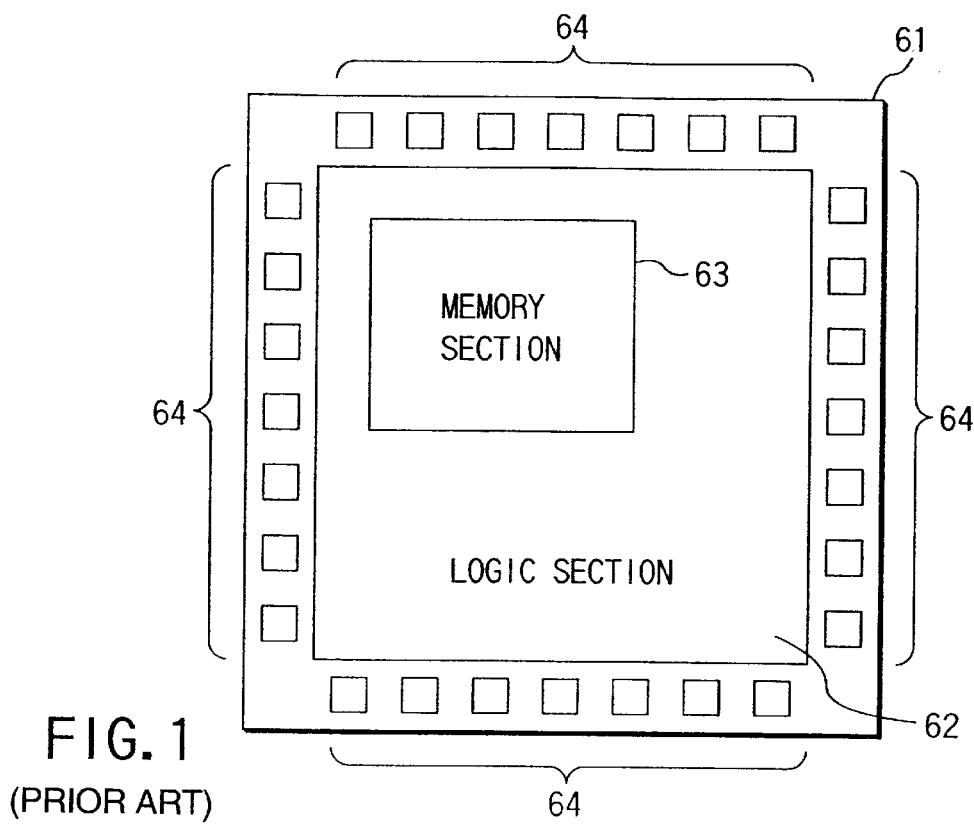
FIG. 1 is a layout of elements on a logic consolidated memory chip.
Figure 2:
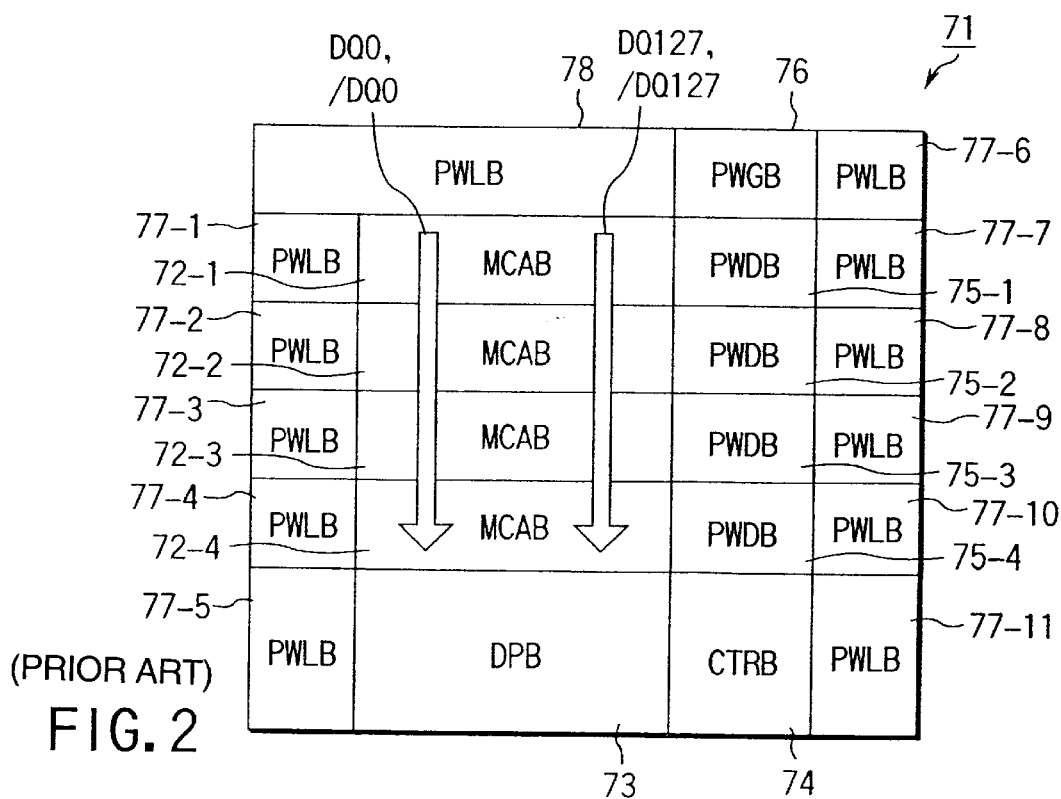
FIG. 2 is a layout showing a structure of a conventional DRAM macro cell.
Figure 3:
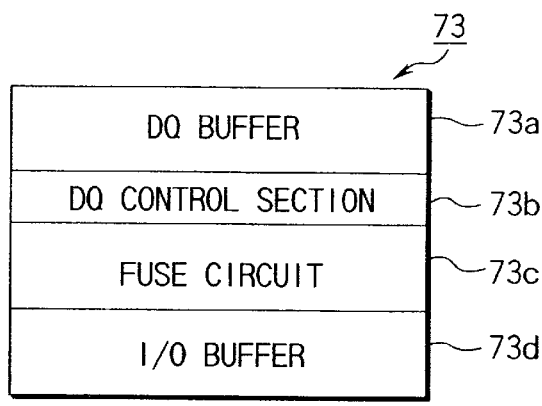
FIG. 3 is a layout showing a structure of a data pass block (DPB) shown in FIG. 2.

Conventionally, in a case where the redundancy circuit is formed, a fuse box (a plurality of fuses), fuse latch circuit, and fuse control circuit are arranged in the data pass block (DPB) 73 (see FIG. 2), so that a large layout area is required for forming a data pass block (DPB) 73 including these circuits.

In the fourth embodiment, the fuse circuits (FBX) 51-1 to 51-16 including the fuse box and the fuse latch circuit are arranged on an opposite side of the data pass blocks (DPB) 30-1 to 30-16 with the memory cell arrays (MCA) sandwiched therebetween. The fuse control circuit (FCT) 52 is formed in the inner region of the DRAM macro cell except the sub memory macro. In this embodiment, the fuse control circuit (FCT) 52 is formed in the power supply generation circuit (PWGB) 23 which is arranged next to the memory array control block (MCB) 21-1 as well as the power supply buffer block (PWBF) 22-1. As a result, the layout area required for formation of the data pass blocks (DPB) 30-1 to 30-16 can be reduced, so that a plurality of sub memory macros are arranged at pitches which are the same as the widthwise length (in the row direction) of the sub memory macro. Therefore, it is easy to arrange the sub memory macros in the row direction.

Now, the arrangement of the fourth embodiment can be similarly applied to the first and second embodiments.

The present invention is not limited to the aforementioned embodiments and may be modified in various ways within the gist of the present invention.

According to the present invention as described in detail in the foregoing, it is possible to provide a semiconductor memory device having a DRAM memory macro cell with an arbitrarily-set number of input/output data lines, and capable of adding a parity bit and a redundancy circuit while preventing an increase of time required for designing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of sub memory macros arranged on a semiconductor substrate, the plurality of sub memory macros being collectively accessed during read-out operation and during writing operation; and
   an operation control circuit for collectively accessing the plurality of sub memory macros during the read-out operation and during the writing operation,
   wherein each of the plurality of sub memory macros comprises:
      a plurality of memory cell arrays each comprising-a plurality of memory cells;
      a data line arranged over the plurality of memory cell arrays, for transmitting write data to be written in a desired one of the memory cells and read-out data read out from a desired one of the memory cells;
      a DQ buffer circuit for holding the write data and the read-out data to be transmitted through the data line; and
      an input/output data line for transmitting the write data from outside, and transmitting the read-out data to the outside;
      an I/0 buffer circuit for holding the write data and the read-out data transmitted through the input/output data line;
      a fuse circuit provided for the plurality of memory cell arrays, for storing a defective column address of a defective one or ones of the memory cells in the plurality of memory cell arrays, the fuse circuit being located opposite to the input/output data line with respect to the plurality of memory cell arrays;
      a DQ switch circuit for switching a connection state between the DQ buffer circuit and the I/0 buffer circuit, the DQ switch circuit being located between the DQ buffer circuit and the I/0 buffer circuit; and
      a switching control circuit for comparing the defective column address stored in the fuse circuit with an input column address which is externally input, and controlling switching of the connection state by the DQ switch circuit based on a result of the comparing.

2. The semiconductor memory device according to claim 1, wherein the plurality of memory cell arrays and the DQ buffer circuit are arranged in a column direction; the data line pair and the input/output data line pair are extended in the column direction; and the plurality of sub memory macros are arranged in a row direction.

3. The semiconductor memory device according to claim 1, wherein the input/output data line pair inputs and outputs one-bit data.

4. The semiconductor memory device according to claim 1, wherein at least one of-the plurality of sub memory macros is a parity cell serving as a parity bit.

5. The semiconductor memory device according to claim 4, wherein, the plurality of memory cell arrays and the DQ buffer circuits are arranged in the column direction; the data line pairs and the input/output data line pairs are extended in the column direction; and the plurality of sub memory macros are arranged in the row direction.

6. A semiconductor memory device comprising:
   a memory macro arranged on a semiconductor substrate and having a plurality of sub memory macros and a plurality of redundancy circuits, the plurality of sub memory macros being collectively accessed during read-out operation and during writing operation, and being associated with the plurality of redundancy circuits, respectively; and
   an operation control circuit for collectively accessing the plurality of sub memory macros during the read-out operation and during the writing operation,
   wherein each of the plurality of sub memory macros comprises:
      a plurality of memory cell arrays each comprising a plurality of memory cells;
      a data line arranged over the plurality of memory cell arrays, for transmitting write data to be written in a desired one of the memory cells and read-out data read out from a desired one of the memory cells;
      a DQ buffer circuit for holding the write data and the read-out data to be transmitted through the data line;
      an input/output data line for transmitting the write data from outside, and transmitting the read-out data to the outside; and
      an I/O buffer circuit for holding the write data and the read-out data transmitted through the input/output data line; and
   wherein each of the plurality of redundancy circuits comprises:
      a fuse circuit for storing a defective column address of a defective one or ones of the memory cells in the memory cell arrays of a corresponding one of sub memory macros, the fuse circuit being located opposite to the input/output data line with respect to memory cell arrays of said corresponding one of the sub memory macros; and
      a DQ switch circuit for switching connection states between the D/Q buffer circuits and the I/O buffer circuits of the sub memory macros, in cooperation with DQ switch circuits provided in the other redundancy circuits, the DQ switch circuit being located between the DQ buffer circuit and the I/O buffer circuit in the associated sub memory macro, and
      a switching control circuit provided for the redundancy circuits, for comparing the defective column address stored in the fuse circuit of each redundancy circuit with an input column address which is externally input, and controlling switching of the connection states between the D/Q buffer circuits and the I/O buffer circuits of the sub memory macros by the DQ switch circuits of the redundancy circuits based on a result of the comparing.

7. The semiconductor memory device according to claim 6, wherein the plurality of memory cell arrays and the DQ buffer circuit are arranged in the column direction; the data line pairs and the input/output data line pairs are extended in the column direction; and the plurality of sub memory macros are arranged in the row direction.

8. The semiconductor memory device according to claim 6, wherein the switching control circuit is arranged in the memory macro excluding the sub memory macros.

* * * * *